(12) United States Patent
Tanaka et al.

(10) Patent No.: US 7,059,872 B2
(45) Date of Patent: Jun. 13, 2006

(54) CONNECTOR

(75) Inventors: Nobuyoshi Tanaka, Yokkaichi (JP); Kiyofumi Ichida, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 10/966,705

(22) Filed: Oct. 15, 2004

(65) Prior Publication Data

US 2005/0085109 A1      Apr. 21, 2005

(30) Foreign Application Priority Data

Oct. 20, 2003    (JP) ............................... 2003-359284

(51) Int. Cl.
*H01R 12/00*      (2006.01)

(52) U.S. Cl. ....................................................... 439/79

(58) Field of Classification Search ................. 439/79, 439/532, 540, 564, 712, 567, 78, 83, 381, 439/607–610, 701, 108, 95, 571, 572, 639, 439/541.5, 540.1
See application file for complete search history.

(56) References Cited

U.S. PATENT DOCUMENTS

| 5,336,109 | A | * | 8/1994 | Hillbish et al. ........... 439/541.5 |
| 5,580,269 | A | * | 12/1996 | Fan .............................. 439/79 |
| 6,077,092 | A | * | 6/2000 | Chiu et al. ..................... 439/79 |
| 6,200,161 | B1 | * | 3/2001 | McClinton et al. ....... 439/541.5 |
| 6,354,875 | B1 | * | 3/2002 | Wu ............................. 439/607 |
| 6,767,225 | B1 | * | 7/2004 | Hwang ........................ 439/79 |

FOREIGN PATENT DOCUMENTS

JP          6-203896          7/1994

* cited by examiner

*Primary Examiner*—Gary Paumen
*Assistant Examiner*—Edwin A. Leon
(74) *Attorney, Agent, or Firm*—Gerald E. Hespos; Anthony J. Casella

(57) ABSTRACT

A housing (20) has a terminal-holding part (22) for holding terminal fittings (21). Two sidewalls (24) extend rearward from the terminal-holding part (22), and substrate-fixing parts (25) project out from outer surfaces of the sidewalls (24). Screws (N) are used to fix the substrate-fixing parts (25) to a substrate (10). An alignment plate (40) is mounted between the sidewalls (24) and has opening-preventing walls (43) locked to the sidewalls (24) to prevent the side walls (24) from being elastically opened as the screws (N) are tightened.

10 Claims, 9 Drawing Sheets

CONNECTOR

BACKGROUND OF THE INVENTION

1. Field of the Invention

The invention relates to a connector for a substrate.

2. Description of the Related Art

Japanese Patent Laid-Open No. 6-203896 and FIG. 9 herein disclose a connector for a substrate. With reference to FIG. 9, the connector has a terminal fitting 1 bent into an L-shape. The terminal fitting 1 is mounted into a terminal holding part 2 and two opposed sidewalls 3 extend rearwardly from the sides of the terminal holding part 2. Substrate fixing parts 4 extend transversely from the lower end of the sidewalls 3. Collectively, the terminal holding part 2, the sidewalls 3 and the substrate fixing part 4 define a housing 5. An alignment plate 6 is positioned between the sidewalls 3 of the housing 5 for positioning the vertical portion of the L-shaped terminal fittings 1.

Screws are passed through the substrate-fixing parts 4 and into the substrate 7. An impact wrench or the like then is used to tighten the screws for fixing the housing 5 to the substrate 7. However, torque acts on the screw during the tightening operation and may deform the sidewalls 3 outward. An outward deformation of the sidewalls 3 can separate the alignment plate 6 from its mounted position between the sidewalls 3.

The invention was developed in view of the above-described situation, and to prevent sidewalls of a connector from being opened elastically.

SUMMARY OF THE INVENTION

The invention relates to a connector for a substrate. The connector includes a housing with a terminal-holding part capable of holding terminal fittings. Two sidewalls extend rearwardly from the terminal holding part and a substrate-fixing part is formed on each sidewall. The substrate-fixing part is configured to accommodate screw means for fixing the housing to a substrate. The connector further includes an opening-preventing member that is locked to the sidewalls to prevent the sidewalls from being opened elastically in response to forces exerted by the tightening of the screw means.

The opening-preventing means preferably includes an alignment plate having at least one positioning hole that receives and positions a substrate-connecting portion of the terminal fitting.

The opening-preventing means prevents the sidewalls from being opened elastically as the screw means is tightened even though an opening force may be applied to the sidewalls due to the torque imparted to the substrate-fixing part by the screw means. More particularly, the engagement between the opening-preventing means and the sidewalls prevents the sidewalls from deflecting outwardly.

The opening-preventing means positions the substrate-connecting portion of the terminal fitting and also prevents the side walls from opening elastically. Thus, the connector provides a simple and effective construction as compared to a connector with separate parts for these two functions.

DETAILED DESCRIPTION OF THE PREFERRED EMBODIMENTS

Figure 1:
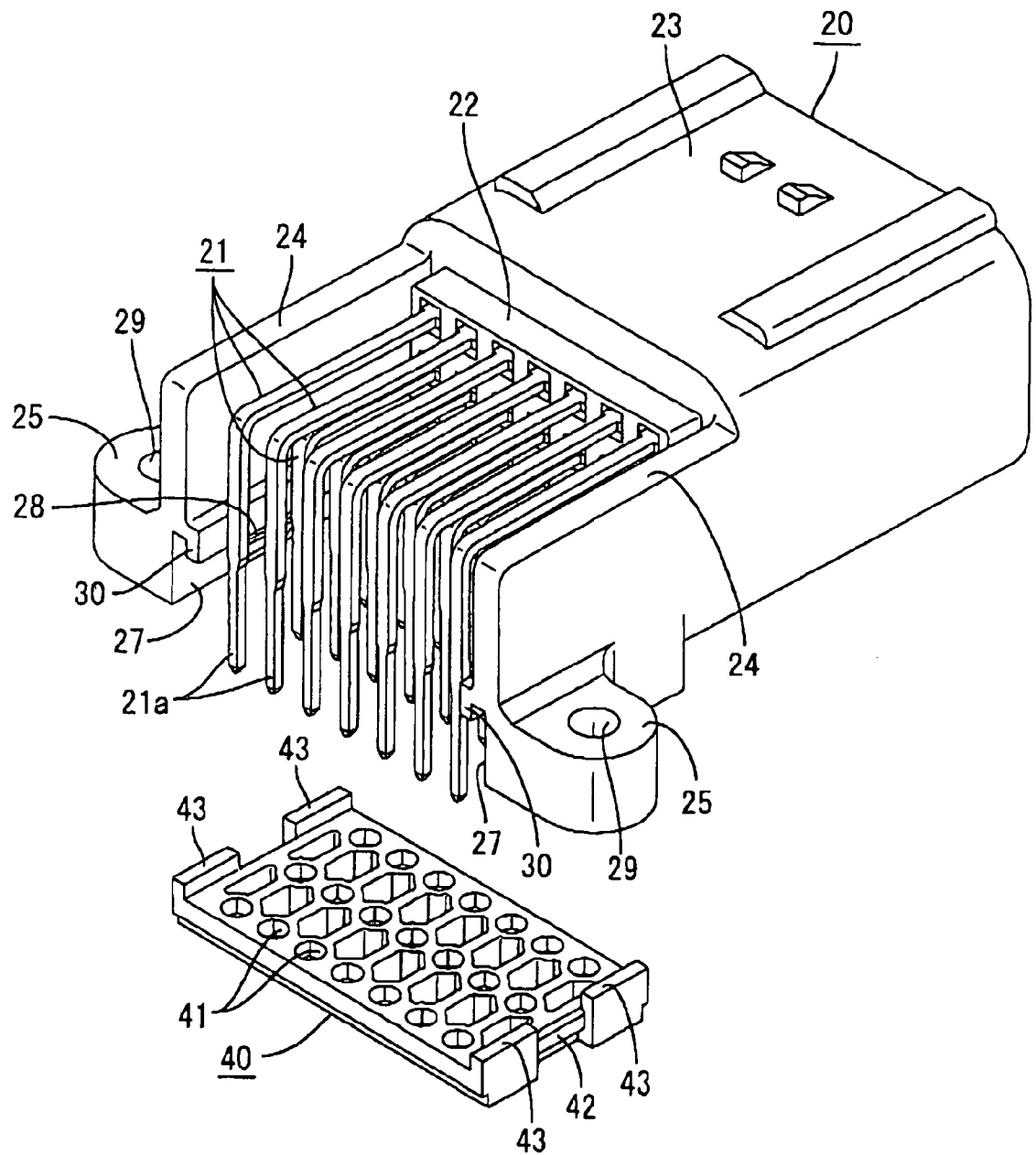
FIG. 1 is an exploded perspective view of a connector according to the invention.
Figure 2:
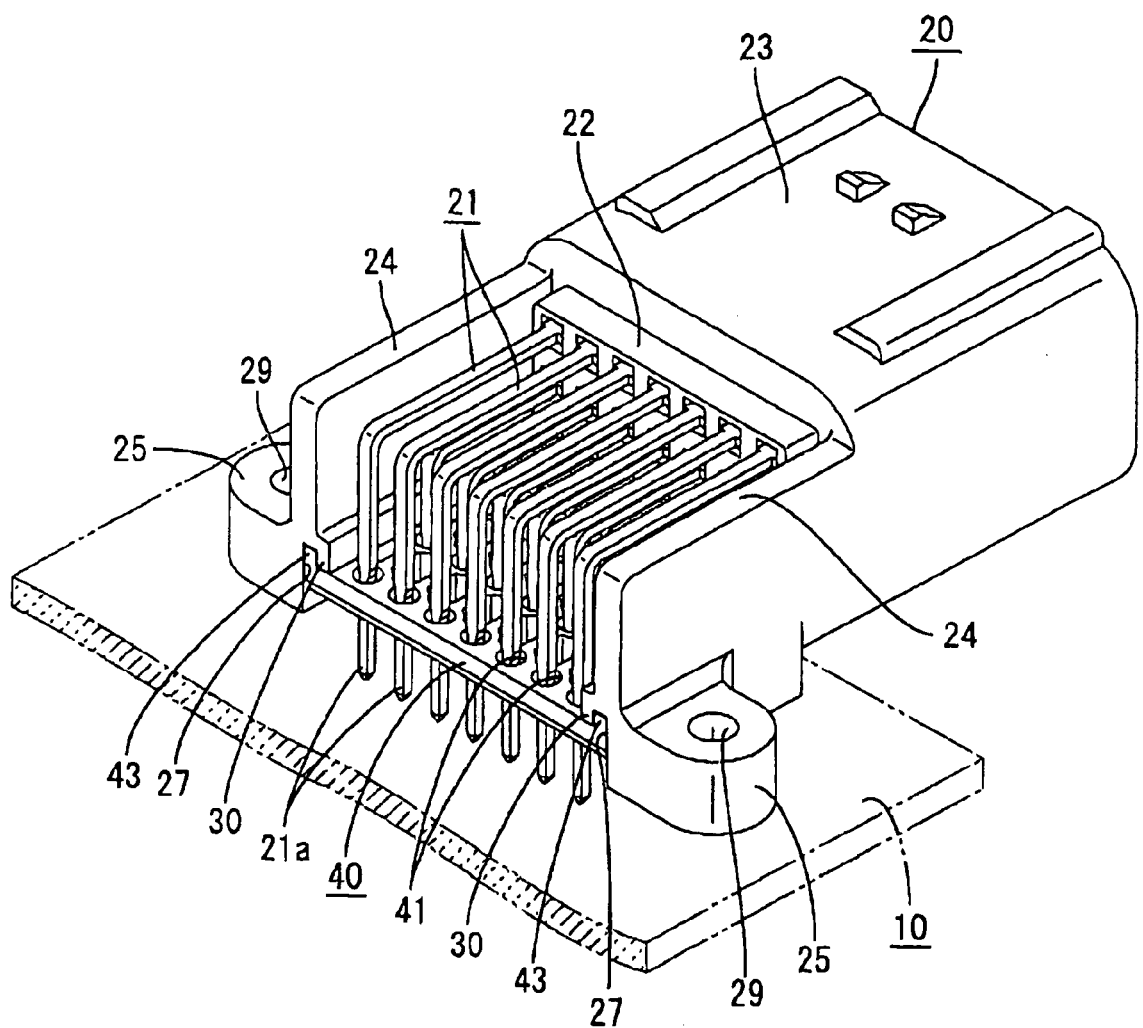
FIG. 2 is a perspective view shoving a state in which the alignment plate has been mounted on the housing shown in FIG. 1.
Figure 3:
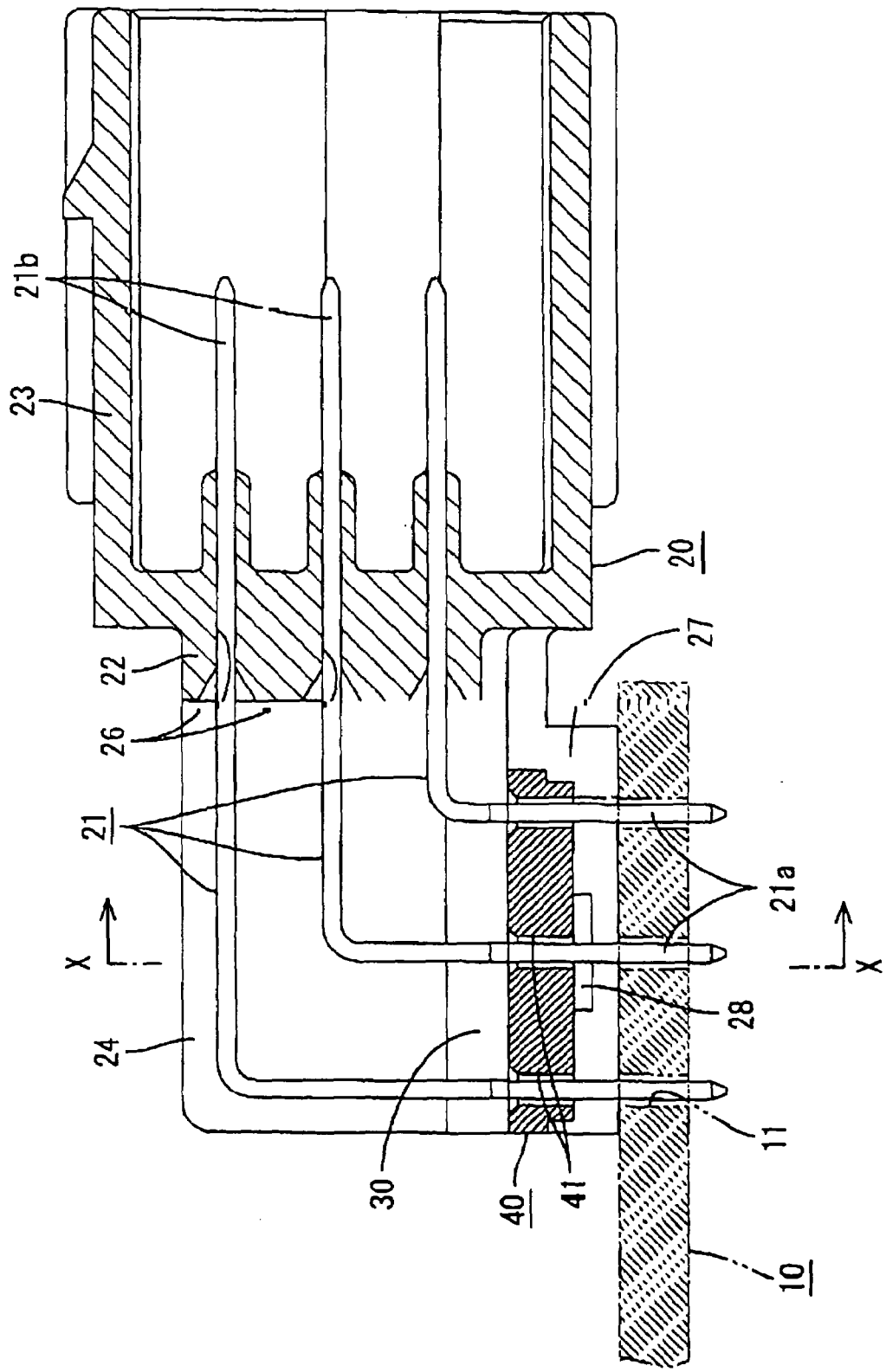
FIG. 3 is a longitudinal cross-sectional view of the connector shown in FIG. 2.

A connector in accordance with the subject invention is illustrated in FIGS. 1–8. The connector has a housing 20 that can be fixed to a substrate 10 by employing tapping screws N. The connector illustrated in FIGS. 1–8 is a male connector and is configured for mating with a female connector (not shown). The side of the housing 20 that is mateable with the female connector is described herein as the front side, and is the right side as shown in FIG. 3. The term "vertical" is used herein to provide a frame of reference and conforms to the orientation shown in each drawing except FIG. 4. However, the use of the term "vertical" is not intended to imply a required gravitational orientation for the connector.

The housing 20 is made of synthetic resin, and, as shown in FIG. 1, has a terminal-holding part 22 capable of holding terminal fittings 21. The terminal-holding part 22 is approximately block-shaped and has opposite front and rear ends. Terminal insertion holes 26 extend longitudinally through the terminal-holding part 22 from the rear end to the front end and are configured for receiving terminal fittings, as shown in FIG. 3. The terminal insertion holes 26 are provided in three steps vertically and seven rows widthwise. A portion of the terminal fitting 21 rearward of the terminal-holding part 22 is bent down to define an L-shape. The vertical lower portion of each terminal fitting 21 defines a substrate connection portion 21a that can be inserted into a connection hole 11 of the substrate 10. The substrate connection portion 21a then can be soldered into electrical connection with a conductive path (not shown) printed on the substrate 10. The substrate connection portion 21a of the terminal fitting 21 is narrower than other portions of the terminal fitting 21. The lengths of the terminal fittings 21 are different according to the steps on which the terminal fittings 21 are disposed. More specifically, the horizontal and vertical lengths of the terminal fitting 21 at an upper step exceed the corresponding dimensions of the terminal fittings 21 disposed at a lower step. Additionally, the vertical portion of the terminal fitting 21 at the upper step is rearward from the vertical portion of the terminal fitting 21 at the lower step.

A hood 23 projects out from the periphery of the terminal-holding part 22 and extends forward to define an approximately square pillar-shaped tube. The mating female housing can be fit in the hood 23 from the front of the housing 20. The hood 23 accommodates a horizontal mating portion 21b of each terminal fitting 21 that projects from the front surface of the terminal-holding part 22. The mating portion 21b of the terminal fitting 21 can be connected electrically to a corresponding female terminal fitting (not shown) inside the female housing. The hood 23 projects from the front end of the substrate 10 when the housing 20 is mounted on the substrate 10 as shown in FIGS. 2 through 4.

Substantially rectangular plate-shaped sidewalls 24 extend rearward from the sides of the rear end of the terminal-holding part 22 and the hood 23, as shown in FIG. 1. The sidewalls 24 are dimensioned to protect portions of each terminal fitting 21 rearward of the terminal-holding part 22, except for the substrate connection portion 21*a*. More specifically, as shown in FIG. 3, the top of the sidewall 24 is above the upper surface of the terminal fitting 21 at the uppermost step, and the rear of the sidewall 24 is rearward from the rear end surface of the terminal fitting 21 at the uppermost step. A sealing potting material (not shown) can be filled into a space rearward of the terminal-holding part 22 and between the side walls 24 when the terminal fittings 21 are mounted in the housing 20. The space between the upper portions of both side walls 24 is open. Therefore air discharged in the hardening process of the potting material escapes easily.

Figure 4:
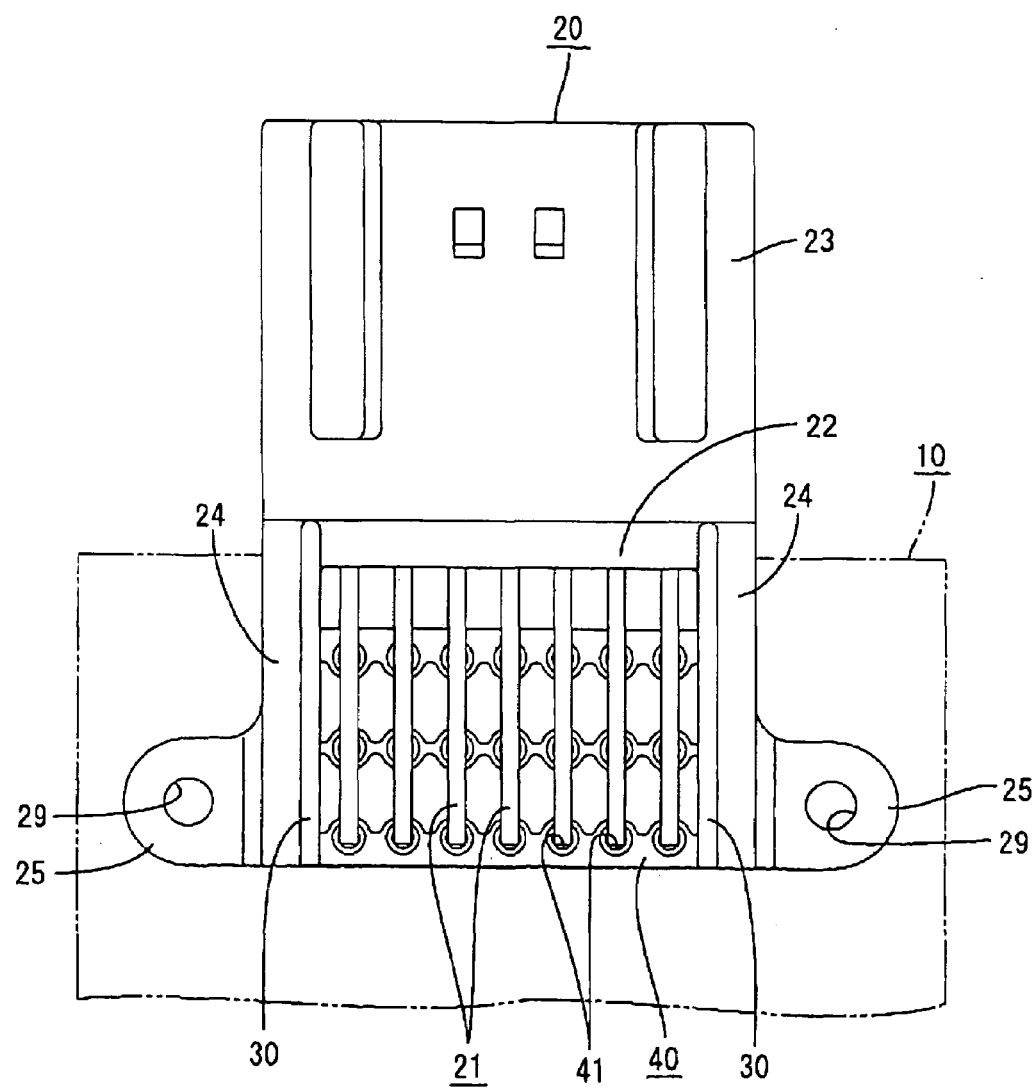
FIG. 4 is a top plan view of the connector shown in FIG. 1.

Substrate-fixing parts 25 project laterally out from the outer surface of both sidewalls 24, as shown in FIGS. 1 and 4. Each of the substrate-fixing parts 25 is continuous with the rear and lower ends of the corresponding sidewall 24. The height of the substrate-fixing part 25 is about ⅓ the height of the sidewall 24.

Figure 5:
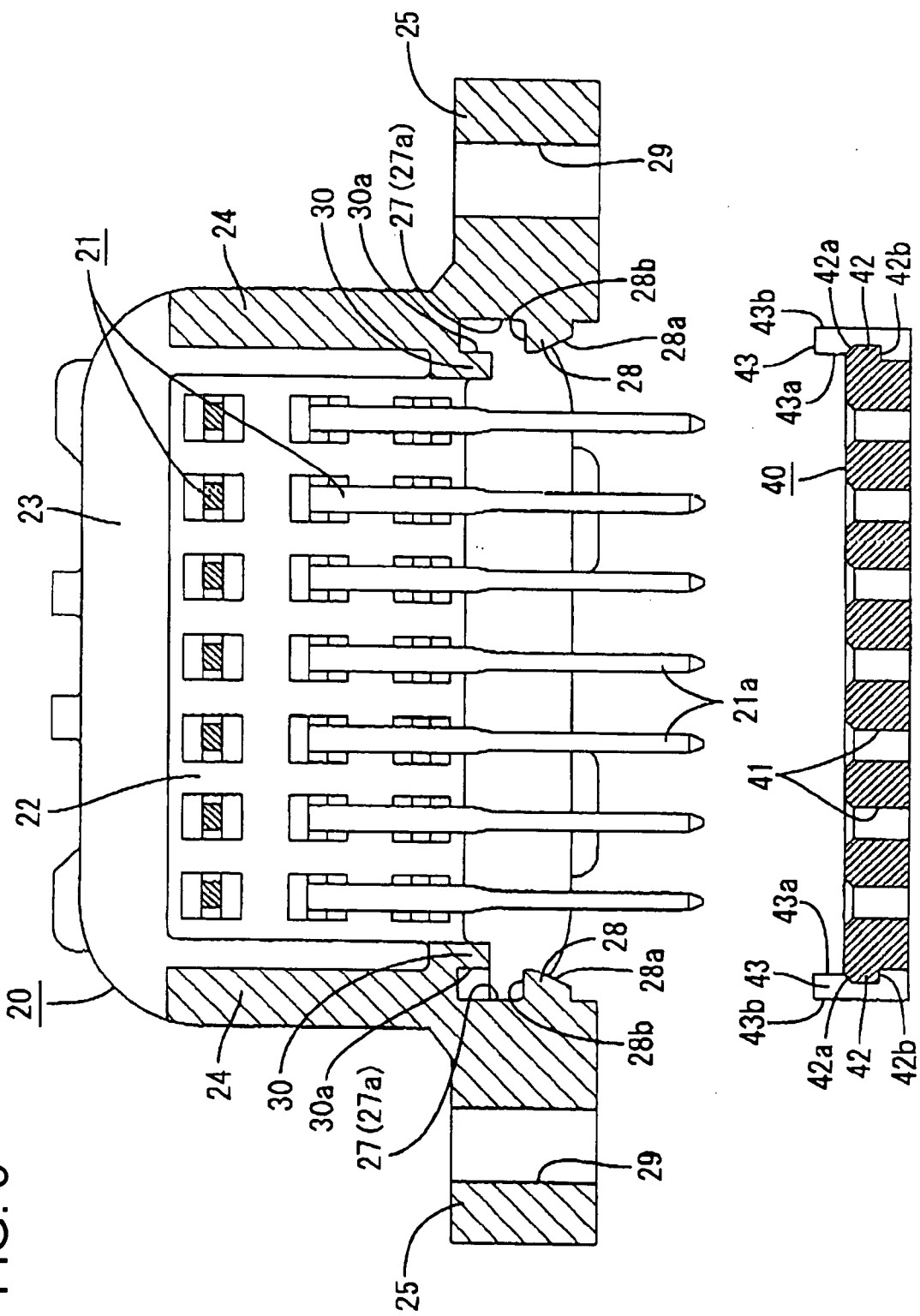
FIG. 5 is a sectional view taken along line 6—6 of FIG. 3, but showing a state in which the alignment plate has not been mounted on the housing.

An inwardly open concavity 27 is formed on the inner surface of the lower portion of each side wall 24, as shown in FIGS. 1 and 5, and corresponds vertically to the respective substrate-fixing part 25. Each concavity 27 has an inwardly facing surface 27*a*. A holding projection 28 projects in from a longitudinal center of each concavity 27. Each holding projection 28 has an inwardly and upwardly sloped lower surface 28*a* and a horizontal upper surface 28*b*.

Figure 6:
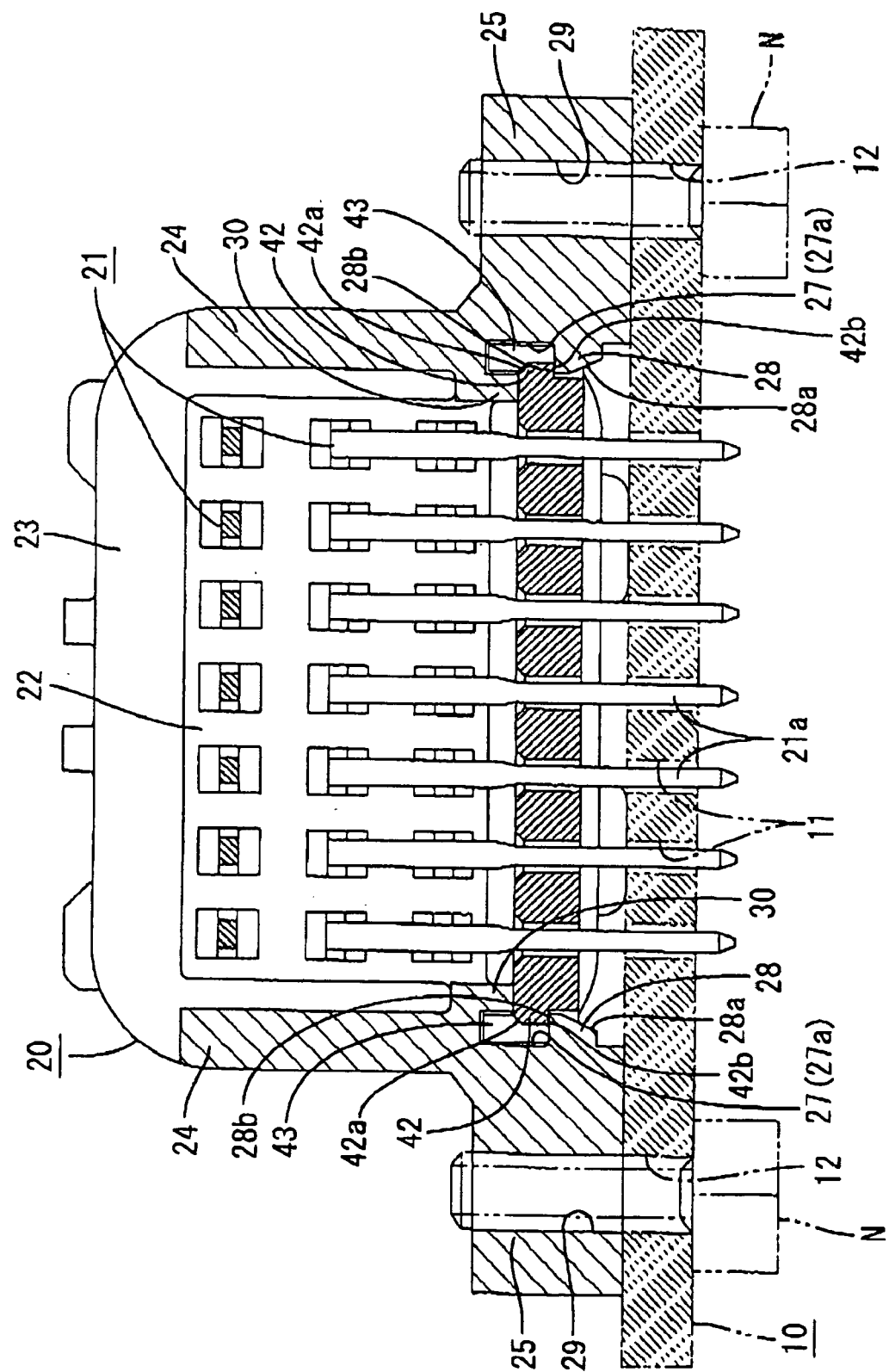
FIG. 6 is a sectional view taken along line 6—6 of FIG. 3.

A screw-tightening hole 29 vertically penetrates each substrate-fixing part 25 and receives a tapping screw N. As shown in FIG. 6, the tapping screw N is inserted up through a screw insertion hole 12 that penetrates the substrate 10 and engages the screw-tightening hole 29 to fix the housing 20 to the substrate 10 at a specified position defined by the relative positions of the substrate-fixing parts 25.

Each side wall 24 has a rigid locking flange 30 that projects down at a position to define an inner boundary of the respective concavity 27. The locking flanges 30 are substantially planar and extend in the longitudinal direction of the housing 20 for the entire length of the respective sidewall 24. Each locking flange 30 has a vertical planar outwardly facing locking surface 30*a* opposed to and spaced inwardly from the inwardly facing surface 27*a* of the respective concavity 27.

Figure 8:
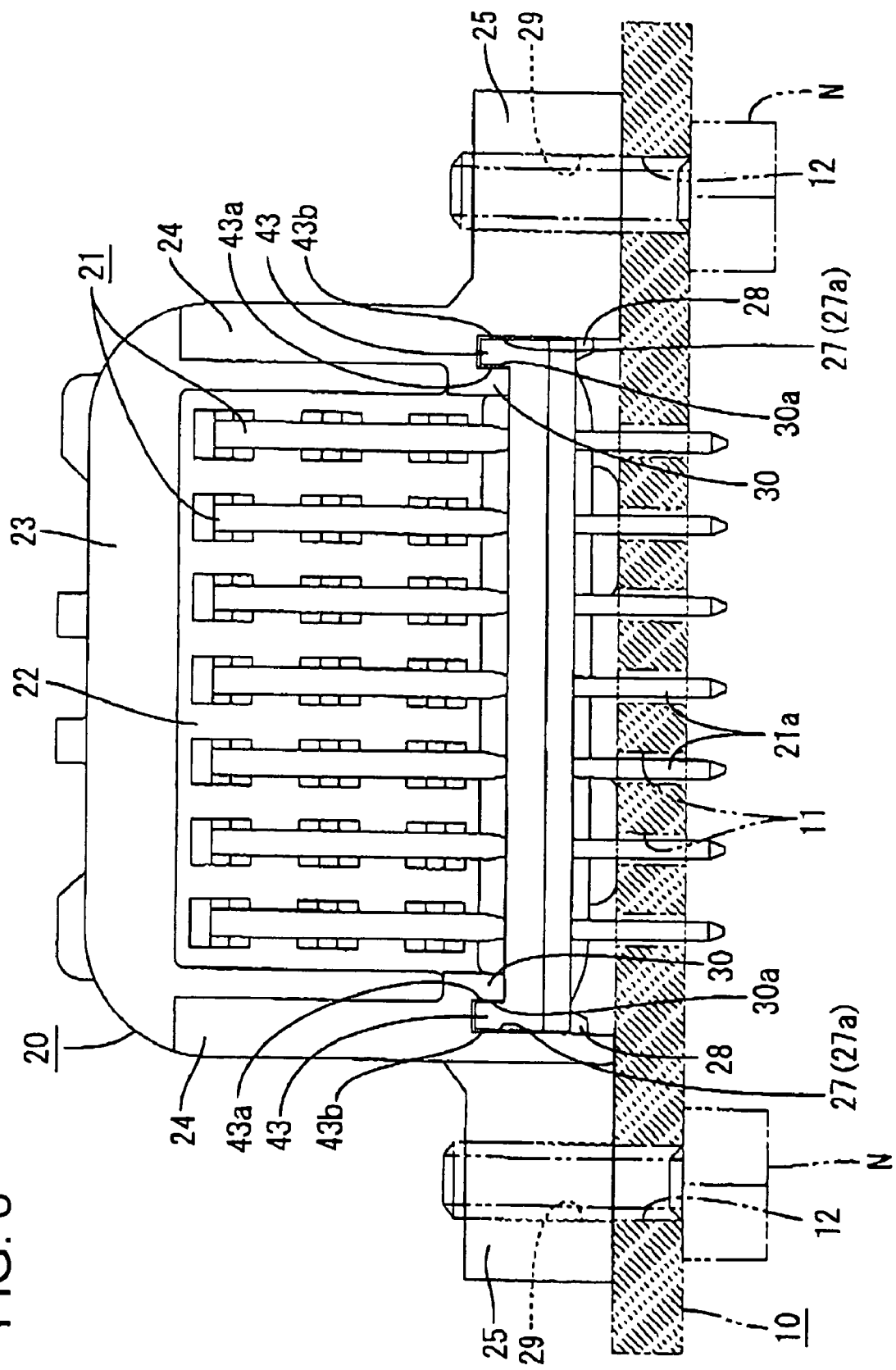
FIG. 8 is a rear view of the assembled connector.
Figure 9:
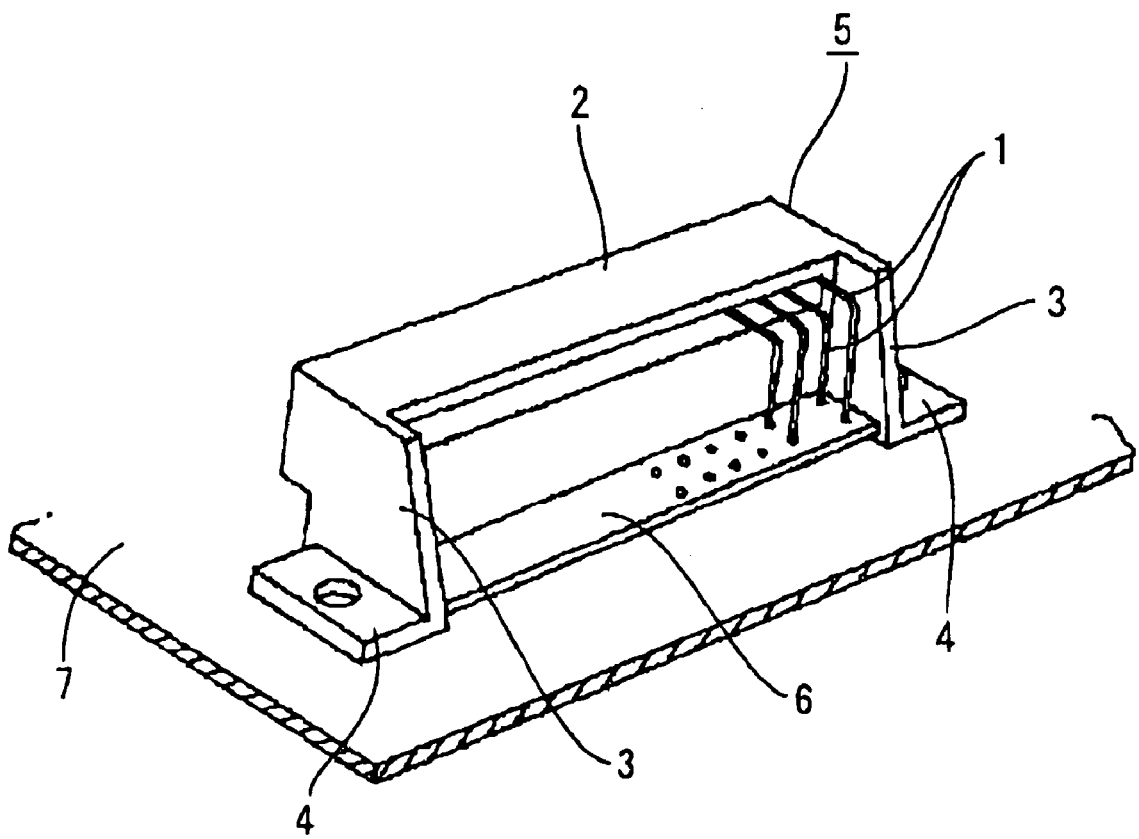
FIG. 9 is a perspective view showing a convetional art.

As shown in FIG. 1, the alignment plate 40 is a substantially flat rectangular plate with opposite top and bottom surfaces, opposite front and rear edges and opposite side edges. The alignment plate 40 is mounted on the housing 20 so that the front and rear edges of the alignment plate 40 are substantially orthogonal to the longitudinal direction of the housing 20. Substantially circular positioning holes 41 penetrate the alignment plate 40 vertically and are dimensioned to receive the substrate connection portions 21*a* of the terminal fittings 21. The number of the positioning holes 41 is equal to the number of terminal fittings 21. The positioning holes 41 are disposed to coincide respectively with the connection holes 11 that penetrate the substrate 10. Thus, as shown in FIG. 8, the substrate connection portions 21*a* that are inserted through the positioning holes 41 will align with the respective connection holes 11 of the substrate 10. The alignment plate 40 is mounted between the sidewalls 24 from below. Locking ribs 42 project out from approximately the center of each side edge of the alignment plate 40 and can be locked to the holding projections 28 of the corresponding side wall 24. As shown in FIG. 5, each locking rib 42 has a slanted upper surface 42*a* aligned to slide against the slanted lower surface 28*a* of the respective holding projection 28 as the alignment plate 40 is mounted between the sidewalls 24. As shown in FIG. 6, lower surfaces 42*b* of the locking ribs 42 are substantially orthogonal to the vertical installing direction of the alignment plate 40 and can engage the upper surfaces 28*b* of the holding projections 28 to lock the alignment plate 40 to the holding projections 28.

Figure 7:
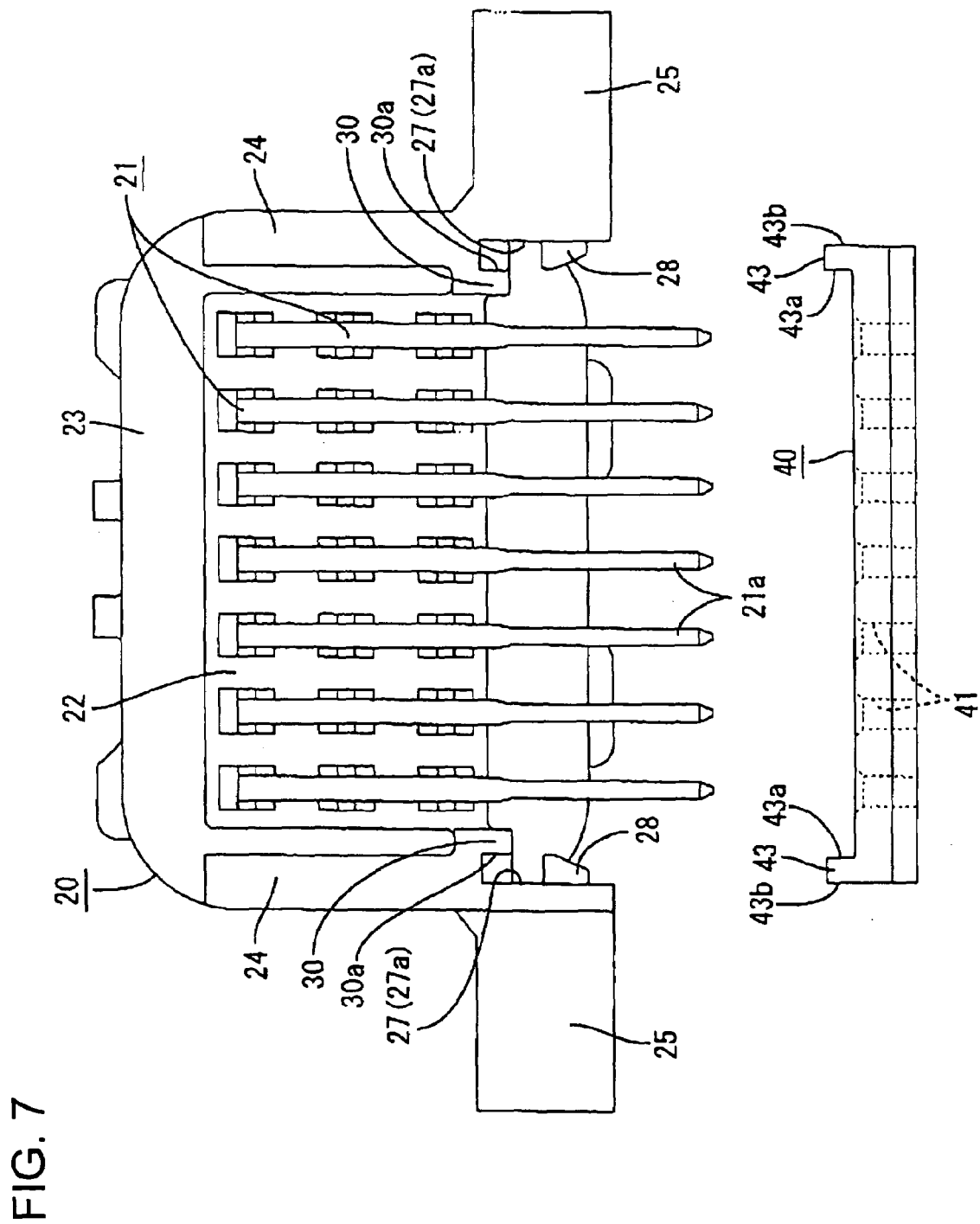
FIG. 7 is an exploded rear view of the connector.

The alignment plate 40 is mounted on the housing 20 and is locked to both side walls 24 for preventing the sidewalls 24 from opening outward in the widthwise direction of the housing 20. More specifically, as shown in FIGS. 1 and 7, the alignment plate 40 has rigid opening-prevention walls 43 at positions forward and rearward of the locking ribs 42. The opening-prevention walls 43 project out and up beyond the locking ribs 42 and enter the concavities 27 on the inner surfaces of the side walls 24 when the alignment plate 40 is mounted on the housing 20. The horizontal thickness of the opening-prevention walls 43 is equal to or slightly less than the spacing between the opposed surfaces 27*a* and 30*a* of the concavity 27. Thus, the alignment plate 40 is mounted on the housing 20, as shown in FIG. 8, so that the inner surface 43*a* of each opening prevention wall 43 locks to the outwardly facing surface 30*a* of the corresponding locking flange 30. As a result, the sidewalls 24 cannot open out in the width direction of the housing 20. An outer side surface 43*b* of the opening prevention wall 43 contacts the inwardly facing surface 27*a* of the respective concavity 27 when the alignment plate 40 is mounted on the housing 20.

The connector is assembled by inserting the terminal fittings 21 straight and horizontally into the corresponding terminal insertion holes 26 from the rear side of the housing 20. A portion of each terminal fitting 21 that projects rearward from the terminal-holding part 22 then is bent substantially perpendicularly down.

As shown in FIGS. 1, 5, and 7, the alignment plate 40 is mounted on the housing 20 after all of the terminal fittings 21 are mounted in the housing 20. The alignment plate 40 is mounted between both sidewalls 24 from below. In this operation, the slanted upper surface 42*a* of the locking rib 42 slides against the slanted lower surface 28*a* of the holding projection 28 while the substrate connection portion 21*a* of each terminal fitting 21 is inserted into the corresponding positioning hole 41. The slanted upper surface 42*a* of each locking rib 42 continues to slide against the slanted lower surface 28*a* of the holding projection 28 as the alignment plate 40 is moved up and generates sufficient outward deflection of the side walls 24 to enable the locking ribs 42 to ride over the holding projections 28. At the same time, the opening prevention wall 43 advances into the gap between the inwardly facing surface 27*a* of the concavity 27 and the outwardly facing surface 30*a* of the locking flange 30. The locking ribs 42 ride across the holding projections 28, as shown in FIG. 6, when the alignment plate 40 advances to a normal depth on the sidewalls 24. As a result, both sidewalls 24 are restored resiliently to their original state, and the lower surfaces 42*b* of the locking ribs 42 are locked to the upper surfaces 28*b* of the holding projection 28. At this time, as shown in FIGS. 2 and 8, a projected lower end surface of the locking flange 30 strikes the upper surface of the alignment plate 40, and a projected upper end surface of the opening-prevention wall 43 strikes the lower surface of the concavity 27. Thus, the alignment plate 40 is sandwiched between the side walls 24 and is held without being shaken vertically. In this assembled state, the inner surface 43*a* of the opening-prevention wall 43 and the outwardly facing surface 30*a* of the locking flange 30 are locked together.

The housing 20 then is placed on the substrate 10, and the screw-tightening hole 29 of the substrate-fixing part 25 is aligned with the screw insertion hole 12 of the substrate 10.

The tapping screw N then is inserted into the screw insertion hole 12 using a power tool, such as an impact wrench. The tightening operation causes the tapping screw N to move forward and to cut into the inner peripheral surface of the screw-tightening hole 29. As a result, screw threads are formed. A torque acts on the tapping screw N at this time, and there is a fear that the torque will act through the substrate-fixing part 25 and cause sidewalls 24 to open outward in the widthwise direction of the housing 20. However, the inner surface 43a of the opening-prevention wall 43 of the positioning plate 40 is locked to the inner surface 30a of the locking flange 30 of the housing 20. Thus, both sidewalls 24 are prevented from opening outward in the widthwise direction of the housing 20. Accordingly, the sidewalls 24 cannot deform plastically and hence will not crack. The sidewalls 24 are prevented from opening outward in the widthwise direction of the housing 20. Thus, it is possible to prevent the locking ribs 42 from being unlocked from the holding projections 28 and hence the alignment plate 40 will not be removed from the sidewall 24. The substrate connection portions 21a of the terminal fittings 21 next are soldered to the connection hole 11. The potting material then is filled into the rear side of the terminal-holding part 22 between the side walls 24, and the mating female housing is fit in the hood 23 to connect the terminal fittings 21 and the female terminal fittings to each other respectively.

As described above, the opening-preventing walls 43 on the alignment plate 40 are locked to the locking flanges 30 on the sidewalls 24. Therefore, it is possible to prevent the sidewalls 24 from being elastically opened while tightening the tapping screw N into the screw-tightening hole 29 of the substrate-fixing part 25, even though a force of opening both sidewalls 24 acts due to the torque imparted to the tapping screw N.

The opening-preventing walls 43 are provided on the alignment plate 40. Thus, this construction is simpler than a construction in which an opening-preventing portion is provided separately from the alignment plate 40. This construction allows the connector to be simple and the number of component parts and mounting steps is reduced.

The invention is not limited to the embodiment described above. For example, the following embodiments are included in the technical scope of the present invention. Further, various modifications of the embodiments can be made without departing from the spirit and scope of the present invention.

The configuration and size of the opening-preventing wall of the alignment plate and the locking flanges of the housing can be altered. For example, the locking flanges may be omitted and the opening-preventing walls may be locked to the outer side surfaces of the sidewalls of the housing. This construction also is capable of preventing the sidewall from opening outward.

In the above-described embodiment, the sidewall is sized to protect the terminal fittings. It is necessary to form the substrate-fixing part on the side wall and possible to alter the configuration and size of the sidewall as desired.

In the above-described embodiment, the opening-preventing walls are formed on the alignment plate. However, an opening-preventing member having an opening-preventing portion may be mounted on the housing separately from the alignment plate. The present invention is applicable to a connector not having an alignment plate.

In the above-described embodiment, the terminal fittings are soldered to the substrate. However, the invention is applicable to a connector using terminals that are press-fit into the substrate. The configuration of the terminal fitting is not limited to "L", but the present invention is applicable to the connector using a straight-type terminal fitting.

What is claimed is:

1. A connector for a substrate comprising:
a housing including a terminal-holding part configured for holding terminal fittings, first and second sidewalls extending rearward from the terminal-holding part, and substrate-fixing parts first and second formed respectively on the sidewalls and configured to be fixed to the substrate by screws;
first and second locking flanges extending from the respective first and second sidewalls and spaced inwardly from the respective first and second substrate-fixing parts, each of said first and second locking flanges having an outwardly facing surface opposed to and spaced from the respective first and second substrate fixing parts; and
an alignment plate having positioning holes disposed for receiving portions of the terminal fittings and aligning the terminal fittings for mounting on the substrate, the alignment plate having opening-preventing portions locked to the sidewalls and engaged in spaces inwardly of the respective substrate-fixing parts and outwardly of the respective locking flanges for preventing the sidewalls from opening elastically in response to forces generated by tightening the screws.

2. The connector of claim 1, wherein the opening preventing member has locking ribs, the sidewalls having holding projections engaged with the locking ribs for holding the alignment plate on the housing.

3. The connector of claim 2, wherein the first and second opposite side edges disposed between the sidewalls of the housing, and the locking ribs being on the side edges of the opening preventing member.

4. The connector of claim 3, wherein each side edge of the opening preventing member has two opening preventing portions and one of the locking ribs disposed between the opening preventing portions.

5. A connector for a substrate comprising:
a housing including a terminal-holding part with opposite front and rear ends, terminal insertion holes extending through the terminal-holding part from the front end to the rear end and configured for holding terminal fittings, first and second sidewalls formed on the terminal-holding part, and first and second substrate-fixing parts extending outwardly from the respective first and second sidewalls and configured to be fixed to the substrate by screws, first and second locking flanges spaced inwardly from the respective first and second substrate fixing parts so that each of said locking flanges has an outer surface opposed to and spaced from the respective substrate fixing parts for defining first and second concavities; and
an alignment plate disposed between the first and second sidewalls and having first and second opening-preventing walls engaged respectively in the first and second concavities and having inwardly facing surfaces engaging the respective outwardly facing surfaces of the locking flanges for preventing the sidewalls from opening elastically in response to forces generated by tightening said screws.

6. The connector of claim 5, further comprising first and second holding projections projecting in from the first and second substrate-fixing parts and below the respective first and second concavities, first and second locking ribs engaged by surfaces of the holding projections facing into the corresponding one of the first and second concavities for holding the alignment plate on the housing.

7. The connector of claim 6, wherein the holding projections and the locking ribs have slanted surfaces aligned for deflecting the sidewalls away from one another as the alignment plate is mounted to the housing.

8. The connector of claim 6, wherein the first and second opening preventing walls each have front and rear sections disposed respectively on opposite sides of the respective first and second locking ribs.

9. The connector of claim 6, wherein the first and second locking flanges have outwardly facing surfaces facing into the respective first and second concavities, the first and second opening-preventing walls having inwardly facing surfaces engaged with the outwardly facing surfaces of the respective first and second locking flanges.

10. The connector of claim 9, wherein the locking flanges engage surfaces of the alignment plate between the opening preventing walls such that the alignment plate is sandwiched between the holding projections and the locking flanges.

* * * * *